United States Patent [19]
Trofimenkoff et al.

[11] Patent Number: 4,775,841
[45] Date of Patent: Oct. 4, 1988

[54] VOLTAGE TO FREQUENCY CONVERSION CIRCUIT WITH A PULSE WIDTH TO PERIOD RATIO PROPORTIONAL TO INPUT VOLTAGE

[76] Inventors: F. N. Trofimenkoff, 20 Varcourt Pl., N.W., Calgary, Alberta, Canada, T3A 0G8; J. W. Haslett, 6547 - 54 Street, N.W., Calgary, Alberta, Canada, T3A 1R5; A. E. Nordquist, 212 Varsity Estates Grove, N.W., Calgary, Alberta, Canada, T3B 4C7

[21] Appl. No.: 870,104

[22] Filed: Jun. 3, 1986

[51] Int. Cl.$^4$ .................. G06G 7/18; H03K 17/00; H03K 5/00; H03L 7/00
[52] U.S. Cl. .................. 328/127; 328/150; 328/58; 307/261; 307/271; 307/265
[58] Field of Search .................. 307/261, 271, 265; 328/58, 150, 127

[56] References Cited
U.S. PATENT DOCUMENTS

| | | | |
|---|---|---|---|
| 3,742,379 | 6/1973 | McLean | 328/127 |
| 3,835,402 | 9/1974 | Kublick | 328/127 |
| 3,970,943 | 7/1976 | Chapman et al. | 328/127 |
| 4,410,812 | 10/1983 | Hönig et al. | 307/261 |
| 4,446,439 | 5/1984 | Mizumoto et al. | 328/140 |
| 4,623,800 | 11/1986 | Price | 328/127 |

*Primary Examiner*—Stanley D. Miller
*Assistant Examiner*—Trong Quang Phan
*Attorney, Agent, or Firm*—Shlesinger, Arkwright & Garvey

[57] ABSTRACT

A voltage to frequency converter controls the successive charge-discharge of an integrating circuit charging capacitor between low and high voltage levels to produce through a reference voltage controlled pulse generating circuit, a pulse output in which the ratio of input voltage to reference voltage equals the ratio of output pulse duration coincident with capacitor discharging, to period duration.

3 Claims, 1 Drawing Sheet

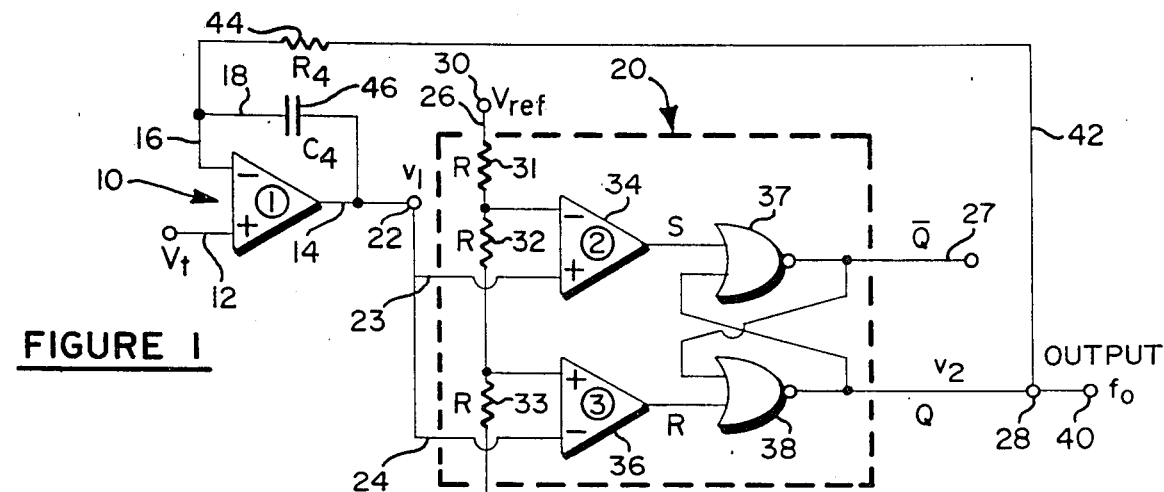
FIGURE 1
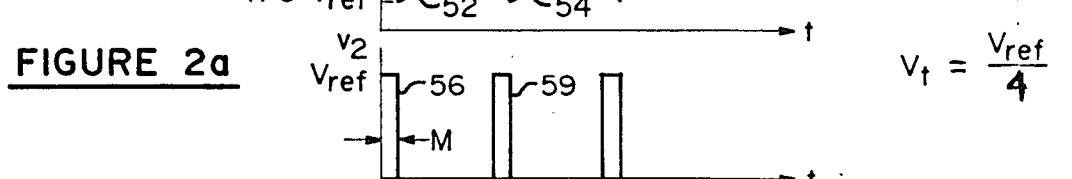
FIGURE 2a    $V_t = \dfrac{V_{ref}}{4}$
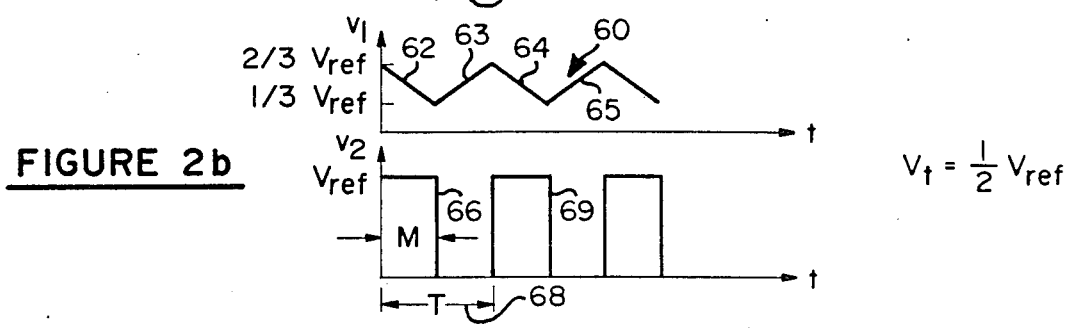
FIGURE 2b    $V_t = \dfrac{1}{2} V_{ref}$
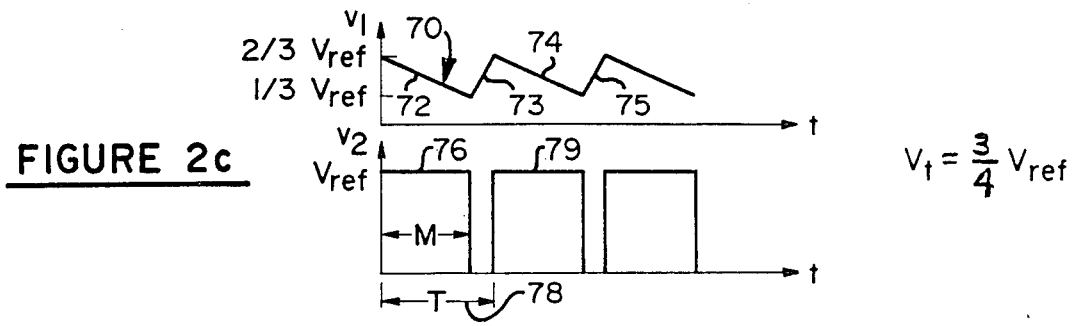
FIGURE 2c    $V_t = \dfrac{3}{4} V_{ref}$

VOLTAGE TO FREQUENCY CONVERSION CIRCUIT WITH A PULSE WIDTH TO PERIOD RATIO PROPORTIONAL TO INPUT VOLTAGE

This invention relates to a voltage to frequency conversion circuits, and particularly to a circuit which can be used effectively in applications in which operation over a very wide temperature range is desirable. Such applications include analog multiplication systems, optically-coupled isolation amplifier system, fibre optic transmission systems, two-wire transmission systems, and analog to digital conversion systems.

In these applications, it is essential that the pulse width to period ratio depend only on the input voltage and a reference voltage and not on other components in the system. This specification describes a voltage to frequency conversion circuit which makes this possible by using a single resistor to charge and discharge a capacitor in a sequence which brings the charge on the capacitor back to the same value once each cycle of operation. As a consequence, neither the value of the resistor nor the value of the capacitor is critical in determining the pulse width to period ratio of the output waveform.

Further, the circuit of this invention uses an integrator-gated latch configuration to provide a controlled capacitor charging-discharging function. Prior art voltage to frequency conversion circuits using the charging-discharging principle are shown in the patents to Chapman U.S. Pat. No. 3,970,943, Honig U.S. Pat. No. 4,410,812, and Mizumoto et al U.S. Pat. No. 4,446,439. These references disclose conversion circuits which are complex circuits as contrasted with that of the subject invention, in which the pulse width to period ratio of the output waveform is keyed to the ratio of the input voltage to a reference voltage, and is independent of the values of the resistor and the capacitor of the integrating circuit.

SUMMARY OF THE INVENTION

Accordingly, this invention contemplates the provision of an improved voltage to frequency conversion circuit which includes an integrator circuit and a pulse generating circuit wherein only the input voltage and a reference voltage are instrumental in determining the pulse width to period ratio of the output waveform.

DESCRIPTION OF THE DRAWINGS

FIG. 1 shows a preferred embodiment of the voltage to frequency converter of the subject invention.

FIG. 2a shows output voltage signals for the circuit of FIG. 1 when the input voltage is substantially less than half the value of the reference voltage.

FIG. 2b shows output voltage signals for the circuits of FIG. 1 when the input voltage is half the reference voltage.

FIG. 2c shows output voltages for the circuit of FIG. 1 in which the input voltage is greater than half the reference voltage.

DESCRIPTION OF THE INVENTION

Referring particularly to FIG. 1, the voltage to frequency conversion circuit includes an integrating circuit consisting of an operational amplifier 10 having a signal input line 12 to which the input signal $V_t$ is applied. The output line 14 from the amplifier is connected to the operational amplifier control lead 16 through feed back line 18.

The output of the operational amplifier 10 is applied along line 14 to the pulse generating circuit generally indicated at 20 through integrator output circuit terminal 22 which is connected through lines 23 and 24 to second operational amplifier 34 and third operational amplifier 36.

The reference voltage line 26 is grounded at 25, with the reference voltage being applied to terminal 30 from which its value is successively and equally reduced through the three equal resistors, generally indicated as R at 31, 32 and 33. The voltage applied to the negative signal input terminal of amplifier 34 is two thirds the value of the reference voltage. The voltage applied to the positive signal input terminal of operational amplifier 36 is one third the value of the reference voltage, since the resistors 31 and 32 reduce such value at this input point to one third the reference voltage.

The reference voltage line and operational amplifiers 34 and 36 form a gating circuit.

A set-reset latch circuit is formed by the cross-connected NOR gates 37 and 38 which act as a flip-flop circuit, with output line 27 providing a zero voltage at $\overline{Q}$ when the latch is set and a high voltage equal to $V_{ref}$ when the latch is reset and with output terminal 28 and output waveform terminal 40, generally indicated by $V_2$ and Q, providing a high voltage equal to $V_{ref}$ when the latch is set and a zero voltage when the latch is reset. A signal return line 42 containing resistor 44 (integrating resistor $R_4$) is connected to control lead 16 of operational amplifier 10 and is connected at that point to feed back line 18 which contains the integrator capacitor 46, generally designated $C_4$.

The integrator circuit consists of the operational amplifier 10 and the resistor 44 and charging capacitor 46. When a positive input signal voltage is applied to input line 12 and the voltage at Q of the pulse generating circuit generally indicated at 20 is at zero volts, a current flow will be produced along line 42 which will charge the capacitor 46. The output terminal 22 of the integrator will increase in voltage from a lower fixed voltage equal to one third of the reference voltage $V_{ref}$ to a fixed voltage equal to two thirds of the reference voltage $V_{ref}$. This is accomplished by the manner in which the operational amplifiers 34 and 36 are biased. The increasing voltage value at output 22 of the integrator will be applied along lead line 23 to the positive signal input terminal of operational amplifier 34 and when the voltage at 34 exceeds two thirds of the reference voltage $V_{ref}$, the voltage applied to the negative input terminal of operational amplifier 34, the set-reset flip flop will be set and the voltage at Q will go to a high value equal to $V_{ref}$. This will result in a current flow along line 42 which will discharge the cpacitor 46 so that the output 22 of the integrator will decrease in voltage from the high fixed voltage level of two thirds of the reference voltage $V_{ref}$, downwardly to the one third reference voltage level applied to the positive input terminal of amplifier 36. When the voltage at output 22 of the integrator falls below the one third reference voltage level applied to the positive signal input lead of operational amplifier 36, the flip flop will be reset, the voltage at Q will go to zero volts, and the cycle will repeat itself. The set-reset circuit 37, 38 will produce a high voltage output at terminal 28 which is generally indicated at $V_2$ and has a high output pulse value equal to the reference voltage during the discharge phase of the charging capacitor 46.

This can be seen by an inspection of the pulses shown in FIGS. 2a, 2b and 2c. In FIG. 2a in which the input voltage $V_t$ is substantially less than half the reference voltage, the output at terminal 22 showing the voltage $V_1$ at the output of the integrating circuit is shown in which the successive discharge-charging cycle between the one third reference voltage and two third reference voltage levels are illustrated by the curve generally indicated at 50 in which the discharging segment 52 is followed by charging slope 53, discharging slope 54 and second charging slope 55. The discharging of the capacitor through the latch circuit along the output line Q provides a voltage $V_2$ pulse shown at 56 which has a duration M. The complete period for the charge-discharge cycle is indicated as T at 58. The charge balance for the charging capacitor 46 would be as follows:

$$-\frac{V_t}{R_4} \cdot T + \frac{V_{ref}}{R_4} \cdot M = 0 \tag{1}$$

where $V_t$ is the input voltage, $R_4$ is resistor 44, T is the period, $V_{ref}$ is the reference voltage, and M is the pulse duration.

This equation can be reduced to:

$$\frac{V_t}{V_{ref}} = \frac{M}{T} \tag{2}$$

showing that the ratio of the input voltage to the reference voltage equals the pulse duration divided by the period. Note that the resistive and capacitive value are not a factor in this relationship and that the average value of the output waveform 40 is exactly equal to $V_t$.

FIG. 2b shows the charge-discharge curve 60, and pulse pattern, when the input voltage $V_t$ is equal to half the reference voltage. The voltage output at integrator output terminal $V_1$ is shown by the successive discharge and charge slopes 62, 63, 64 and 65 of curve 60 which alternately charge between the upper and lower fixed voltage levels of one third and two thirds of the reference voltage.

In this instance, the pulse 66 appears at the latch output line Q and terminal 28 an 40, note the pulse width M of 66 is half of the period duration T, as indicated at 68. Succeeding output pulse 69 is of similar duration as output pulse 66.

FIG. 2c shows a third set of voltage versus time plot for $V_1$ terminal voltage and $V_2$ terminal voltage, where the input signal voltage $V_t$ is greater than half the reference voltage. In this instance, the discharge-charge curve generally indicated at 70 has long discharge voltage slope sections 72 and 74 and abrupt charging slope sections 73 and 75. The pulse duration M for pulses 76 and 79 are a very high percentage of the period duration T as indicated at 78. These curves for FIG. 2a, FIG. 2b, and FIG. 2c illustrate the relationship of equation 2 indicated above, in which the proportion of input signal voltage to reference voltage is equal to the pulse duration divided by the period duration and the average value of the output waveform 40 is exactly equal to $V_t$.

The output frequency $f_0$ which appears at the output terminal 40 of FIG. 1, can be calculated as follows:

$$\frac{V_t(T-M)}{R_4 C_4} = \gamma V_{ref} = \frac{(V_{ref} - V_t)M}{R_4 C_4} \tag{3}$$

where $\gamma = \frac{1}{3}$ for the circuit of FIG. 1.

Transposing of this equation gives:

$$T = \frac{\gamma R_4 C_4}{\frac{V_t}{V_{ref}}\left(1 - \frac{V_t}{V_{ref}}\right)}, \tag{4}$$

and then $$f_0 = \frac{1}{\gamma R_4 C_4} \frac{V_t}{V_{ref}}\left(1 - \frac{V_t}{V_{ref}}\right) \tag{5}$$

Frequency $f_0$ increases from 0 when the input signal voltage $V_t$ is equal to zero to a maximum of one quarter of the reciprocal of the product of gamma and the resistive and capacitive values, $R_4$ and $C_4$, when the input signal voltage $V_t$ is one half of the reference voltage. It then decreases to 0 as the input signal voltage $V_t$ increases from half the reference voltage to the full reference voltage. The maximum output frequency is therefore:

$$f_{0max} = \frac{1}{4\gamma R_4 C_4} \tag{6}$$

and this is equal to $$\frac{3}{4 R_4 C_4}$$

for FIG. 1.

The simplicity of the circuits can be more fully appreciated when it is noted that in FIG. 1 the pulse generating circuit generally indicated at 20 is a CMOS 555 timer circuit with appropriate pin connections followed by an inverter. The integrator circuit includes an operational amplifier chip, and the integrator resistor and the charging capacitor. This simple five element circuit is much less complex than previous circuits.

The circuit of FIG. 1 can also be operated in a bipolar mode by connecting 25 to $-V_{ref}$ rather than to ground and powering the NOR gates so that Q is equal to $V_{ref}$ when the latch is set and Q is equal to $-V_{ref}$ when the latch is reset. In such a case, $$\frac{M}{T} = \frac{1}{2}\left[1 + \frac{V_t}{V_{ref}}\right] \tag{7}$$

and $$f_0 = \frac{1}{4\gamma R_4 C_4}\left[1 - \frac{V_t}{V_{ref}}\right]\left[1 + \frac{V_t}{V_{ref}}\right] \tag{8}$$

This modification extends the range of the input signal voltage $V_t$ to $-V_{ref} \leq V_t \leq +V_{ref}$.

While this invention has been described as having preferred design, it is understood that it is capable of further modification, uses and/or adaptations of the invention following in general the principle of the invention and including such departures from the present disclosure as come within known or customary practice in the art to which the invention pertains, and as may be applied to the essential features set forth, and fall within the scope of the invention of the limits of the appended claims.

What is claimed is:

1. A voltage to frequency converter in which the output pulse width to period ratio is essentially independent of all circuit resistor values and the circuit capacitor value and is dependent only on the input voltage and a reference voltage, comprising:

(a) an integrator circuit constructed using an operational amplifier with a positive input terminal which is used as the signal input terminal, a negative input terminal and an output terminal, a capacitor with one end connected to the negative input terminal of the operational amplifier and the other end connected to the output terminal of the operational amplifier, and an integrator resistor with one end connected to the negative input terminal of the operational amplifier, and (b) a pulse generating means connected to and controlled by the output terminal of the integrator operational amplifier and having an output terminal connected to the other end of the integrator resistor, and producing an output pulse train with a low output voltage level equal to zero and a high output voltage level equal to the reference voltage for controlling in a fixed charge-discharge period the charging and discharging of the capacitor through the integrator resistor, whereby when the output voltage of the pulse generating means is low, the output terminal of the integrator moves from a low level fixed voltage equal to one third of the reference voltage provided by the pulse generating means to a high level fixed voltage equal to two thirds of the reference voltage also provided by the pulse generating means, and immediately when the higher fixed voltage is reached, discharging the capacitor through the integrator resistor when the output of the pulse generating means is high and equal to the reference voltage so that the output of the integrator returns to the low level fixed voltage equal to one third of the reference voltage.

2. The voltage to frequency converter as set forth in claim 1, wherein the pulse generating means includes:

(a) a three equal-resistor chain connected to the reference voltage to provide a high level fixed voltage equal to two thirds of the reference voltage and a low level fixed voltage equal to one third of the reference voltage, (b) a gating circuit consisting of a pair of operational amplifiers having positive input, negative input and output leads in which one amplifier has its positive input lead connected to the output of the integrator circuit and has its negative input lead biased at the high level fixed voltage equal to two thirds of the reference voltage and the other amplifier has its negative input lead connected to the output of the integrator circuit and has its positive input lead biased at the low level fixed voltage equal to one third of the reference voltage, and (c) a latch consisting of a pair of cross-connected NOR gates which are powered by the reference voltage, the output of one of the gating circuit operational amplifiers connected to an input of one of the NOR gates and the output of other gating circuit operational amplifier connected to an input of the other NOR gate, with the output of the pulse generating means taken to be the output of the NOR gate with an input connected to the gating circuit amplifier which has its negative input lead connected to the output of the integrator circuit.

3. The voltage to frequency converter as set forth in claim 1, wherein the pulse generating means is a complementary metal-oxide-semiconductor (CMOS) 555 timer integrated circuit having an inverted output.

* * * * *